United States Patent [19]

Seo et al.

[11] Patent Number: 5,063,597
[45] Date of Patent: Nov. 5, 1991

[54] MUTING CIRCUIT IN A DIGITAL AUDIO SYSTEM

[75] Inventors: Jung-Hoon Seo, Seoul; Sung-Mo Seo, Suwon, both of Rep. of Korea

[73] Assignee: SamSung Electronics Co., Ltd., Kyung Ki-Do, Rep. of Korea

[21] Appl. No.: 395,508

[22] Filed: Aug. 18, 1989

[30] Foreign Application Priority Data

Aug. 23, 1988 [KR] Rep. of Korea ............... 1988-10699

[51] Int. Cl.$^5$ ..................... G10L 5/00; G06F 11/10
[52] U.S. Cl. ..................................... 381/47; 375/5; 377/54; 455/54
[58] Field of Search ............... 381/46, 47, 73.1, 94; 375/99, 104; 455/174, 194; 360/32, 38.1

[56] References Cited

U.S. PATENT DOCUMENTS

| | | | |
|---|---|---|---|
| 4,430,742 | 2/1984 | Milleker et al. | 375/104 |
| 4,683,386 | 7/1987 | Kamikawara | 455/194 |
| 4,811,370 | 3/1989 | Yamada et al. | 360/32 |

*Primary Examiner*—Emanuel S. Kemeny
*Attorney, Agent, or Firm*—Robert E. Bushnell

[57] ABSTRACT

A muting circuit in a digital audio system having a digital signal processor, a first latch, a second latch, a comparator for comparing data in the first and second latches, an address encoder, a counter, a memory, a divider, a multiplier and a switching circuit, wherein disturbing beat noises generated during the turning off of power to the system or generated null data pop noises generated in response to external influences or internal circuitry influences are muted.

17 Claims, 3 Drawing Sheets

MUTING CIRCUIT IN A DIGITAL AUDIO SYSTEM

BACKGROUND OF THE INVENTION

This invention relates to a digital audio system which converts a speech signal to digital data, and particularly to a muting circuit which mutes noises generated instantaneously during the process of turning off the power, or noise of null data generated by the data which is damaged by the influence of external or internal circuitry.

In a digital audio system, usually, media for recording or a radio frequency signal for broadcasting are input to the audio system and converted into digital data to be processed. Then, it is converted back into an analog signal which is an audible speech signal. There are various kinds of digital audio systems such as a digital tape recorder, a compact disc player, a pulse code modulation (PCM) processor, a digital tuner and a digital amplifier.

In a prior muting circuit in a digital audio system, as is shown in FIG. 1, an electronic switch SW is connected between an output terminal of a low frequency amplifier 10, for amplifying the converted analog speech signal and outputting it to a given next stage, and a ground terminal. The electronic switch SW operates by a muting signal from a system controller (not shown) through a line 13. Then, the output of the low frequency amplifier 10 is passed to the ground terminal through the electronic switch SW so that the noises are muted.

However, the speech signal 2a of FIG. 2 input to the low frequency amplifier 10 is output in the form of the speech signal as shown in waveform 2c and is distorted by the affection of instantaneous pop noises when the electronic switch SW is turned on at the moment t that a signal for muting shown as waveform 2b changes abruptly to a logic high state. Therefore, there is a problem such that, at the point of muting, disturbing beat noises are generated by the pop noise or a transient phenomenon of the audio system.

SUMMARY OF THE INVENTION

It is an object of the present invention is to provide an improved muting circuit in a digital audio system.

It is another object to provide a muting circuit which mutes disturbing beat noises generated by pop noises during a process of muting, said beat noises being generated because of damaged data by the pop noises during the process of turning off power to the system and because of an external influence.

According to an aspect of the invention the muting circuit includes: a digital signal processor (DSP) for outputting a word clock train, a mute control signal and a digital data in a given bit; a first latch for receiving the digital data and the word clock from the DSP and latching the digital data by the word clock; a second latch for latching and delaying the digital data from the first latch by use of the word clock from the DSP; a comparator for generating a comparison signal by comparing the digital data of the first and the second latch so as to detect whether the amplitude of waveforms of the speech signal is in a state of increasing or decreasing; an address encoder for receiving the comparison signal of the comparator and the most significant bit (MSB) from the first latch by the mute control signal from the DSP and generating a given address preset according to the logic value of the two input signals; a counter for receiving the address from the address encoder by the mute control signal from the DSP and generating a sequential address which increases one by one at given times beginning with the inputted address by the word clock train from the DSP; a memory for reading out second digital data stored in advance at an address corresponding to the sequential address of the counter, which increases one by one at given times; a divider for dividing first digital data from the first latch to a first input port of said divider by fixed data input continuously to a second input port of said divider and generates a third digital data which is the result of said dividing process; a multiplier for multiplying the second digital data read out from the memory by the third digital data generated at the divider and producing fourth digital data which is the result of said multiplying process; and a first switching circuit for receiving the mute control signal and the first digital data from the DSP and the fourth digital data from the multiplier, and then selecting and outputting selectively the first or the fourth digital data to a digital-to-analog converter according to the logic state of the mute control signal.

Many other features, advantages and additional objects of the present invention will become manifest to those versed in the art upon making reference to the detailed description which follows and the accompanying sheet of drawings.

BRIEF DESCRIPTION OF THE DRAWINGS

For a better understanding of the invention and to show how the same may be carried into effect, reference will now be made, by way of example, to the accompanying diagrammatic drawings, in which.

DESCRIPTION OF THE PREFERRED EMBODIMENT

With connection to the accompanying drawings, a preferred embodiment of the present invention will now be illustrated hereinafter detailedly.

Figure 1:
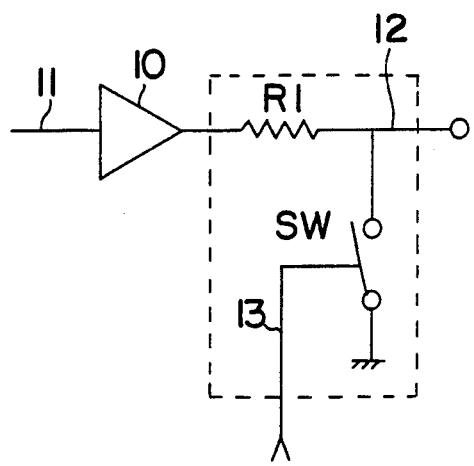
FIG. 1 shows a circuit diagram of a muting circuit n an audio system according to a prior art.
Figure 2A:
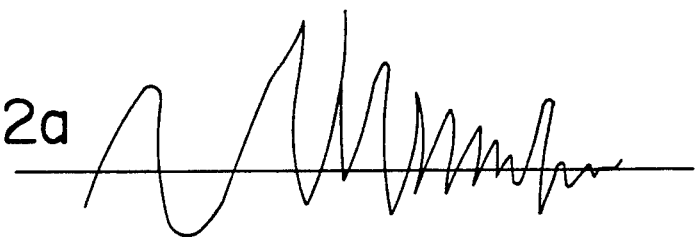
FIG. 2(a) shows an exemplary output waveform from a low-frequency amplifier 10 of FIG. 1, for example, an amplified voice signal.
Figure 2B:
FIG. 2(b) shows a logic level of the mute request control signal 13.
Figure 2C:
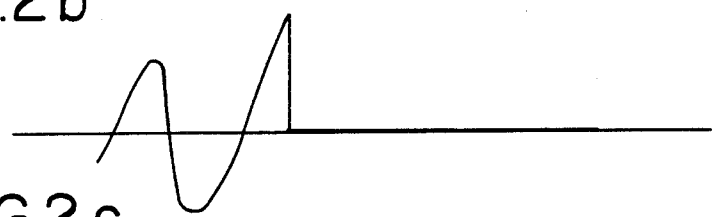
FIG. 2(c) shows an output waveform at an output line 12 of the FIG. 1 circuit.
Figure 3:
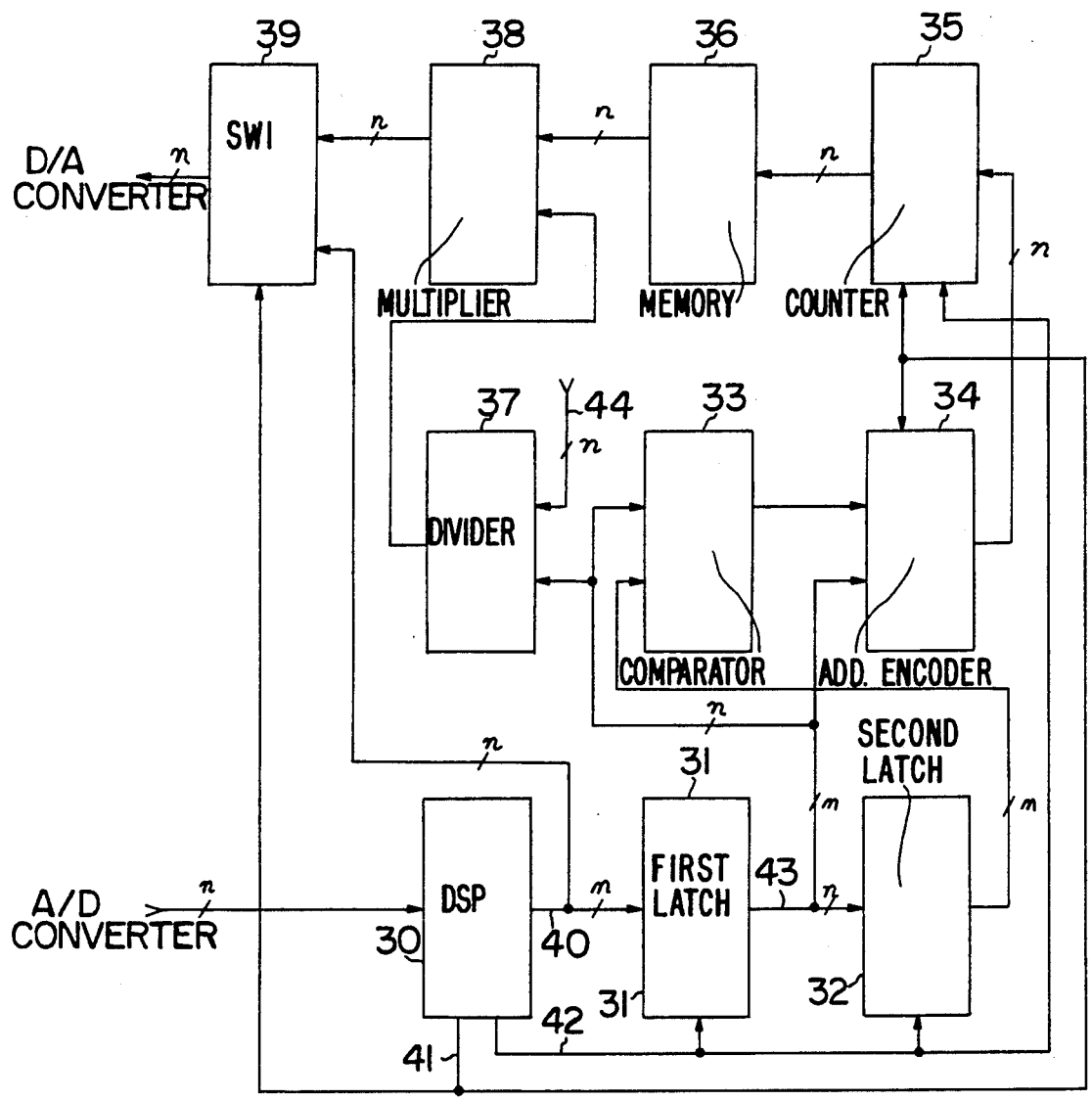
FIG. 3 shows an operational circuit diagram of a preferred embodiment according to the present invention.

Referring to FIG. 3, there is shown a circuit diagram of a preferred embodiment according to the invention, wherein a reference numeral 30 designates a digital signal processor (DSP); 31, a first latch; 32, a second latch; 33, a comparator; 34, an address encoder; 35, a counter; 36, a memory; 37, a divider; 38, a multiplier; and 39, a first switching circuit.

The digital signal processor (DSP) 30 outputs a word clock train, a mute control signal and digital data which is a processed digital speech signal in received from an analog-to-digital converter (hereinafter referred to as A/D converter). The first latch 31 receives the digital data and the word clock from the DSP 30 and latches the digital data by the word clock. Then the second latch 32 latches and delays the digital data from the first latch by use of the word clock from the DSP 30.

Thereafter the comparator 33 generates a comparison signal by comparing the digital data of the first and the second latch circuits (31, 32) so as to detect whether the amplitude of waveforms of the speech signal is in a state of increasing or decreasing. The address encoder 34, receiving the comparison signal of the comparator 33 and the most significant bit (MSB) of the digital data which is code data from the first latch 31 by the mute control signal from the DSP 30, generates a given address preset according to the logic values of its two input signals.

Therefore, the counter 35, receiving the address from the address encoder 34 by the mute control signal from the DSP 30, generates a sequential address which increases one by one of given times beginning with the input address by the word clock train from the DSP 30. The memory 36 reads out second digital data stored in advance at an address corresponding to the sequential address of the counter 35, which increases one by one at given times. The divider 37 divides first digital data from the first latch 31 to a first input port of divider 37 by fixed data continuously input to a second input port of said divider and generates third digital data which is the result of said dividing process.

Accordingly, thereafter the multiplier 38 multiplies the second digital data read out from the memory 36 by the third digital data generated at the divider 37 and produces fourth digital data which is the result of said multiplying process.

The first switching circuit (SW1) 39 receives the mute control signal and the first digital data from the DSP 30 and the fourth digital data from the multiplier 38, then selects and outputs selectively the first or the fourth digital data to a digital-to-analog converter (hereinafter referred to as D/A converter) according to the logic state of the mute control signal.

The preferred embodiment of the invention will be illustrated in detail, with reference to FIG. 3 described above.

At the state of turning on the power, DSP 30 continuously generates the word clock train and outputs it to a line 42. At the state of normal operation, namely when the first digital data which is a processed digital speech signal from the A/D converter is conducted via bus line 40 and the first switching circuit 39 to the A/D converter, the DSP 30 outputs the mute control signal of a logic low state to a line 41

At the state of muting, the DSP 30 outputs the mute control signal of a logic high state to the line 41. Then, the first switching circuit 39 receives the first digital data on the bus line 40, by the mute control signal of a logic low state, and outputs it to the D/A converter.

On the other hand, the first latch 31 latches the first digital data from the DSP 30 through the bus line 40 by the word clock train from the DSP 30 through the bus line 42, and outputs them to a bus line 43.

The second latch 32 latches the first digital data on the bus line 43, by the word clock train on bus line 42 so that the first digital data is delayed as long as one period of the word clock train and input to the comparator 33. Thereafter, when the digital speech data damaged by the system itself is recieved by DSP 30 from the A/D converter and therefore a listener wants to mute the damaged speech data, DSP 30 reverses the mute control signal, on the line 41, at a logic low state to a mute control signal with a logic high state to output.

Meanwhile, the comparator 33 receives the first digital data output before the state of muting from the first latch 31 on the bus line 43 and the last of the first digital data output just before the output of first latch 31 from the second latch 32. Thereafter, comparator 33 compares the two data input, and outputs the compared signal informing, in a logic state, whether the waveform of the speech signal is in the state of increasing or decreasing to the address encoder 34.

Then, when the logic state of the mute control signal applied to the address encoder 34 from DSP 30 through the bus line 41 changes from the logic low state to the logic high state, the address encoder 34 detects the compared signal produced from the comparator 33 and the most significant bit (MSB) of the first latch 31 which is the logic state of code data. Therefore, the changing state of the speech signal waveform is detected by the logic state of the input signal, so that one address of a plurality of addresses which is preset in advance for each different logic value is selected by the counter 35 according to the change of the speech data.

Then, the counter 35, when the logic state of the mute control signal is changing from the logic low state to the logic high state, loads the address from the address encoder 34 and outputs to the memory 36 a given number of sequential addresses which increases one by one beginning with the logic value of the loaded address by the word clock train received by counter 35 from the DSP 30 through the line 42. The memory 36 then reads the second digital data saved in advance at an address, which is addressed by the sequential address from the counter 35 and outputs it sequentially to the multiplier 38.

On the other hand, the divider 37 receiving the first digital data, through the bus line 43, from the first latch 31 divides the first digital data by fixed digital data applied continuously to the divider 37 through a bus line 44. So, a third digital data, as a result, is produce to be provided to the multiplier 38.

Accordingly, the multiplier 38 receiving the second digital data from the memory 36 and the third digital data from the divider 37 outputs fourth digital data, by multiplying the second digital data by the third digital data, to the first switching circuit 39. Then, the first switching circuit 39 receives the fourth digital data which is, the output of the multiplier 38, in accordance with the mute control signal of the logic high state on line 41, and provides it to the converter.

Additionally, after a sampling the waveform of one period of the given frequencies is carried out, the second digital data saved in the memory 36 is quantizized with a given "n" bits and preset in the memory sequentially.

The fourth digital data produced from multiplier 38 is one of either a waveform decreasing from a given positive level to a zero level sweeping over the phase 90 degrees to 180 degrees, or another waveform increasing from a given negative level to said zero level over the phase 270 degrees to 360 degrees.

Figure 4:
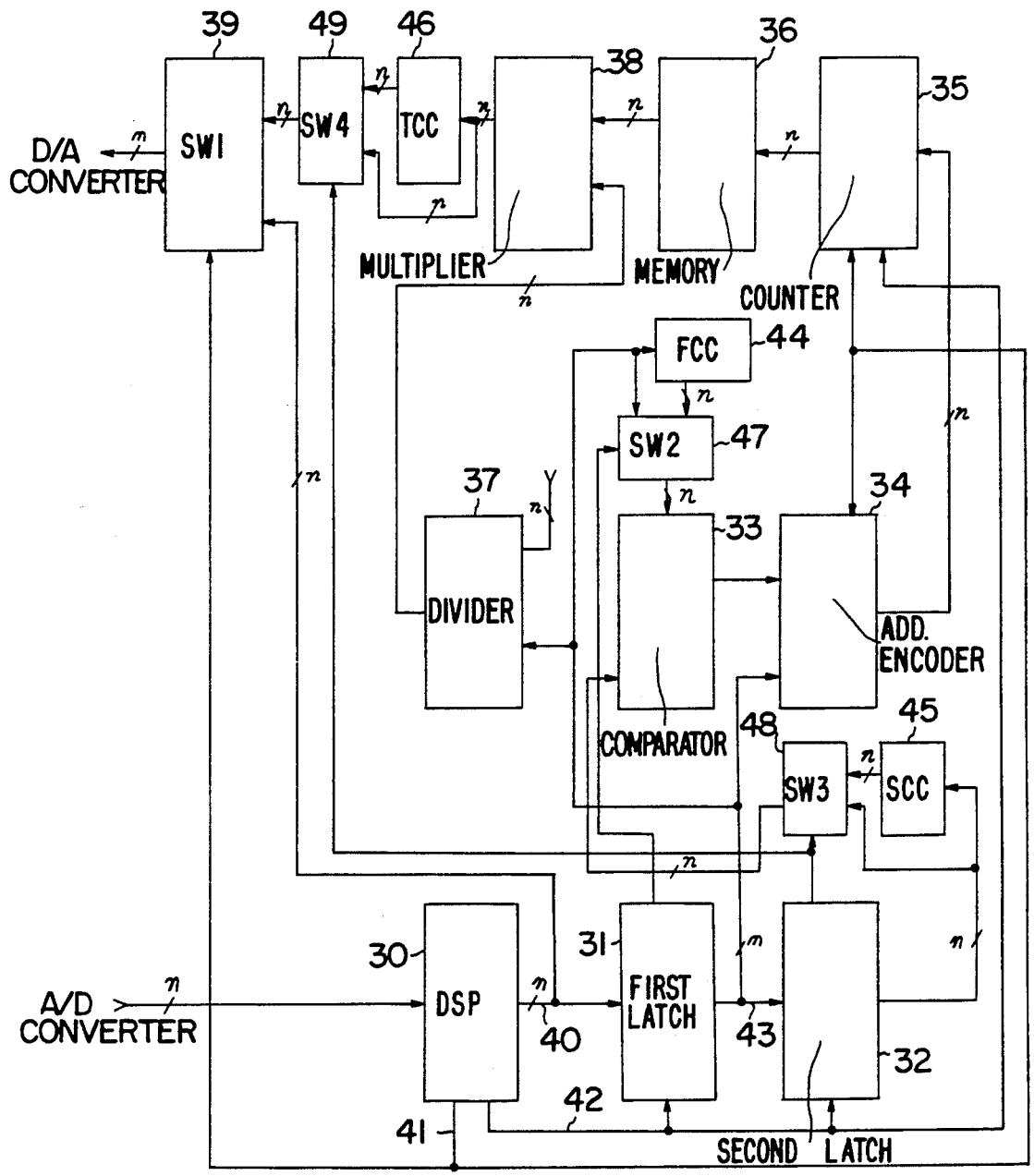
FIG. 4 shows an operational circuit diagram of another preferred embodiment according to the present invention.

The FIG. 4 shows another preferred embodiment according to the invention including a DSP 30, a first and second latch (31, 32), a comparator 33, an address encoder 34, a counter 35, a memory 36, a divider 37, a multiplier 38 and a first switching circuit (SW1) 39, which have the same functions and reference numerals as the same components in FIG. 3. This other preferred embodiment additionally includes a first complementary circuit (FCC) 50, a second switching circuit (SW2)

47, a second complementary circuit (SCC) 45, a third switching circuit (SW3) 48, a third complementary circuit (TCC) 46, and a fourth switching circuit (SW4) 49.

The first complementary circuit 50, which complements the output of the first latch 31, is connected between the first latch 31 and the comparator 33. The second switching circuit 47, connected between the first latch 31 and the comparator 33, outputs the output data of first complementary circuit 50 and the first latch 31 to the comparator 33 by the most significant bit of the first latch 31 which is code data. The second complementary circuit 45, connected between the second latch 32 and the comparator 33, complements the output of the second latch 32. Besides, the third switching circuit 48 outputs selectively, according to the switching, the output data of the second complementary circuit 45 or the output data of the second latch 32 by use of the most significant bit which is the code data of the data from the second latch 32. The third complementary circuit 46, connected between the multiplier 38 and the first switching circuit 39, complements the fourth digital data which is the output of the multiplier 38. Then, the fourth switching circuit 49, connected between the multiplier 38 and the first switching circuit 39, outputs selectively the output data of the multiplier 38 or the third complementary circuit 47 to the first switching circuit 39 by use of the most significant bit which is code data, of the first digital data from the first latch 31.

This other preferred embodiment of the invention will now be illustrated in detail, in connection with FIG. 4 as described above.

As detailed operational features of the other preferred embodiment shown in FIG. 4 overlaps with that of FIG. 3, only the data flowing relation between the first and second latch (31, 32) and the comparator 33, and data transmission relation between the multiplier 38 and the first switching circuit 39 will be illustrated.

The first and second latch (31, 32) outputs the first digital data delayed by one and two periods, respectively. When the first digital data is positive, said first digital data produces the most significant bit data which is logic high. Then, the second and third switching circuit (47, 48) receive the outputs of the first and second latch circuits (31, 32) respectively, and output them it to comparator 33. Besides, the fourth switching circuit 49 receives the fourth digital data of the multiplier 38 and outputs it to the first switching circuit 39.

However, if the first digital data is negative, the first digital data has a most significant bit data with a logic low state. Then, the second and third switching circuits (47, 48) receive the complemented outputs of the first and second complementary circuits (44, 45) and output them to the comparator 33, and the fourth switching circuit 49 outputs the complemented output of the multiplier 38 to the first switching circuit 39.

As mentioned above, the positive type of digital data can all be processed in positive type with the help of the first to the third complementary circuits 44-46 and the second to the fourth switching circuits 47 to 49. In this case, the memory 36 samples an amount of a quarter of the entire quantizized data. Namely, the phase from 90 degrees to 180 degrees in one period of sine waveform is sampled by said memory 36 to be stored therein after the quantization. The third complementary circuit 46 implements that the phase from 270 degrees to 360 degrees is inverted with respect to the phase 90 degrees to 180 degrees.

As mentioned above, the invention has an advantage of preventing the generation of disturbing beat noises by allowing the inventive muting circuit to reach zero potential gradually, not abruptly, at the starting point of the muting operation.

Although specific constructions and procedures of the invention have been illustrated and described herein, it is not intended that the invention be limited to the elements and constructions disclosed. One skilled in the art will easily recognize that the particular elements or subconstructions may be used without departing from the scope and spirit of the invention.

What is claimed is:

1. A muting circuit for use in a digital audio system, comprising:

digital signal processor means for outputting a word clock signal, a mute control signal and a digital data word which is a digital speech signal from an analog-to-digital converter;

first latch means for receiving the digital data word and the word clock signal and for latching the digital data word in response to the word clock signal;

second latch means for latching and delaying the digital data word from the first latch means based upon the word clock signal;

comparator means for generating a comparison signal by comparing the digital data word of the first and second latch means to detect whether an amplitude of a waveform of the speech signal is in an increasing state or in a decreasing state;

address encoder means for receiving the comparison signal and most significant bit data of said digital data word of the first latch means, which is a code data, in response to the mute control signal and for generating a preset address;

counter means for receiving the preset address from the address encoder means and for generating incremented sequential addresses incremented by one at given times beginning with the preset address in response to the word clock signal from the digital signal processor means;

memory means for reading first digital data stored in advance at addresses corresponding to each of the sequential addresses of the counter means, incremented by one for a given time;

divider means for generating second digital data by dividing the digital data word, input from the first latch means to a first input port, by a fixed data inputted to a second input port;

multiplier means for generating third digital data by multiplying the first digital data read by the memory means and the second digital data generated by the divider means; and first switching means for receiving the mute control signal and the digital data word generated from the digital signal processor means and the third digital data from the multiplier means, for selecting and outputting selectively the digital data word or the third digital data in response to a logic state of the mute control signal.

2. A muting circuit in a digital audio system comprising:

digital signal processing means for receiving a digital audio signal and for outputting digital data words and corresponding word clock pulses;

first means for latching said digital data words in response to said word clock pulses;

second means for latching and delaying a first output of said first means in response to said word clock pulses;

comparing means for comparing said first output of said first means to a delayed first output from said second means in response to the most significant bit of said first output of said first means and for comparing a second output of said first means to a second output of said second means also in response to said most significant bit of said first output of said first means, said comparing means generates a result signal;

address encoding means for receiving said result signal and said most significant bit of said first output from said first means and for receiving a mute control signal from said digital signal processing means for generating a preset address according to said result signal and said most significant bit of said first output of said first means;

counter means for receiving said preset address and said word clock pulses and for counting from said preset address to provide sequential address signals;

memory means for receiving said sequential address signals and for providing prestored data;

dividing means for receiving said first output at a first input and predetermined data at a second input and for dividing said first output received at said first input by said predetermined data received at said second input and providing a divided output signal;

multiplying means generating a multiplied output signal in dependence upon said prestored data and divided output signal;

switch means for responding to said mute control signal from said digital processing means for outputting said multiplied output signal or said digital data words output from said digital processing means.

3. The muting circuit in a digital audio system as set forth in claim 2, wherein said first means comprises:
first latch means for receiving said digital data words and providing said first output to said comparing means and said second means; and
first complementary circuit means for receiving said first output and for providing said second output of said first means to said comparing means.

4. The muting circuit in a digital audio system as set forth in claim 3, wherein said second means comprises:
second latch means for receiving said first output of said first means and for providing said delayed first output to said comparing means; and
second complementary circuit means for receiving said delayed first output and for providing said second output of said second means to said comparing means.

5. The muting circuit in a digital audio system as set forth in claim 4, wherein said comparing means comprises:
a comparator;
a first switch coupled to receive said first output of said first latch means and said second output from said first complementary circuit and for providing one of said first or second outputs of said first latch means and said first complementary circuit means to a comparator; and
a second switch for receiving said delayed first output from said second latch and said second output from said second complementary circuit and for providing one of said delayed first output or said second output of said second latch and said second complementary circuit to said comparator.

6. The muting circuit in a digital audio system as set forth in claim 5, wherein said first switch provides said first output of said first latch means and said second switch provides said delayed first output of said second latch means to said comparator if said most significant bit of said first output of said first means indicates said first output of said first means has a positive value; and
said first switch provides said second output from said first complementary circuit means and said second switch provides said second output from said second complementary circuit means to said comparator if said most significant bit of said first output of said first means indicates said first output of said first means has a negative value.

7. The muting circuit in a digital audio system as set forth in claim 6, wherein said multiplying means comprises:
a multiplier coupled to recieve said divided output signal;
third complementary circuit means for receiving an output of said multiplier; and
a third switch an output of said third complementary circuit and said output of said multiplier and for providing either said output of said third complementary circuit means or said output of said multiplier to said switch means as said multiplier output signal.

8. A muting circuit, comprising:
processing means for providing mute control signals, digital data words and clock signals, in response to input signals received;
means for providing delayed data words by delaying said digital data words in dependence upon said clock signals;
comparing means for generating resultant signals based upon comparisons between successive said digital data words and successive said delayed data words;
encoding means for generating initial address signals in dependence upon said resultant signals and components of said digital data words;
means for providing second data words in response to said sequential address signals;
means for providing intermediate data words by varying said second data words in dependence upon said digital data words; and
means for selecting either said digital data words or said fourth data words on a basis of said mute control signals.

9. The muting circuit of claim 8, further comprised of said comparing means generating said resultant signals to indicate whether amplitudes of said input signals received represented by said digital data words are increasing or decreasing in amplitude.

10. The muting circuit of claim 8, further comprised of said encoder means providing said initial address signals in dependence upon said resultant signals and the most significant bit of said digital data words.

11. The muting circuit of claim 8, wherein said means for providing said second data words comprises:
counting means for responding to said mute control signals and said initial address signals by generating, and incrementally changing, sequential address signals; and memory means for reading said second data words in dependence upon said sequential address signals.

12. The muting circuit of claim 8, further comprising:
means for generating complements of said digital data words, said delayed data words, and said fourth data words; and
means for providing either said complement of said digital data words and said complement of said delayed data words, to said comparing means for said comparisons, in dependence upon said components of said digital data words and corresponding components of said delayed data words.

13. The muting circuit of claim 12, wherein said components of said digital data words comprise the most significant bits of said digital, and said corresponding components of said delayed data words comprise the most significant bits of said delayed data words.

14. The muting circuit of claim 12, further comprising:
means for generating complements of said intermediate data words; and
switching means for providing either said intermediate data words or said complements of said intermediate data words, to said selecting means, in dependence upon said corresponding components of said delayed data words.

15. The muting circuit of claim 14, further comprised of said comparing means generating said resultant signals to indicate whether amplitudes of said input signals received represented by said digital data words are increasing or decreasing in amplitude.

16. The muting circuit of claim 15, further comprised of said encoder means providing said initial address signals in dependence upon said resultant signals and the most significant bit of said digital data words.

17. The muting circuit of claim 16, wherein said means for providing said second data words comprises:
counting means for responding to said mute control signals and said initial address signals by generating, and incrementally changing, sequential address signals; and
memory means for reading said second data words in dependence upon said sequential address signals.

* * * * *

UNITED STATES PATENT AND TRADEMARK OFFICE
CERTIFICATE OF CORRECTION

PATENT NO.   :   5,063,597
DATED        :   5 November 1991
INVENTOR(S)  :   Jung-Hoon SEO and Sung-Mo SEO It is certified that error appears in the above-identified patent and that said Letters Patent is hereby corrected as shown below:

Column 2,   Line 34,   change "n" to --in--;

Claim 5,    Column 7,   Line 62,   insert --means-- after "circuit";

Line 66,   replace "for receiving" with --coupled to receive--;

Column 8,   Line 2,    insert --means-- after "latch";

Line 3,    insert --means-- after "circuit";

Claim 6,    Column 8,   Line 5,    insert a colon after "wherein";

Claim 7,    Column 8,   Line 21,   replace "recieve" with --receive--;

UNITED STATES PATENT AND TRADEMARK OFFICE
CERTIFICATE OF CORRECTION

PATENT NO. : 5,063,597

DATED : 5 November 1991

INVENTOR(S) : Jung-Hoon SEO and Sung-Mo SEO

It is certified that error appears in the above-identified patent and that said Letters Patent is hereby corrected as shown below:

Claim 7, Column 8, Line 25, insert --coupled to receive- after "switch".

Signed and Sealed this

Twenty-third Day of February, 1993

*Attest:*

STEPHEN G. KUNIN

*Attesting Officer*     Acting Commissioner of Patents and Trademarks